US010470339B2

(12) United States Patent
Peng et al.

(10) Patent No.: US 10,470,339 B2
(45) Date of Patent: Nov. 5, 2019

(54) HEAT-PIPE HEAT DISSIPATION SYSTEM AND POWER DEVICE

(71) Applicant: Huawei Technologies Co., Ltd., Shenzhen (CN)

(72) Inventors: Yaofeng Peng, Hangzhou (CN); Zhijian Li, Shenzhen (CN); Honghui Liu, Hangzhou (CN); Shanjiu Chi, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/468,859

(22) Filed: Mar. 24, 2017

(65) Prior Publication Data

US 2017/0196124 A1    Jul. 6, 2017

Related U.S. Application Data

(63) Continuation of application No. PCT/CN2015/092689, filed on Oct. 23, 2015.

(51) Int. Cl.
*H05K 7/20* (2006.01)
*F28D 15/02* (2006.01)
*F28D 15/04* (2006.01)

(52) U.S. Cl.
CPC ..... *H05K 7/20681* (2013.01); *F28D 15/0266* (2013.01); *F28D 15/04* (2013.01);
(Continued)

(58) Field of Classification Search
CPC ........... H05K 7/20681; H05K 7/20327; H05K 7/20381; H05K 7/20336; H05K 7/20672; F28D 15/04; F28D 15/0266; F28D 15/043
(Continued)

(56) References Cited

U.S. PATENT DOCUMENTS 6,840,304 B1 *  1/2005  Kobayashi ............. B01D 3/007
                                              165/104.25
9,043,035 B2 *  5/2015  Chainer ............... G05D 7/0635
                                              700/282
(Continued)

FOREIGN PATENT DOCUMENTS

CN         1224830 A        8/1999
CN         1570534 A        1/2005
(Continued)

OTHER PUBLICATIONS

"Thermal Performaces of a fully passive capillary pumped loop with heat flux up to 90 W/cm2 at evaporator," CALYOS, Imaps, 10th European Advanced Technology Workshop on Micropackaging and Thermal management, Feb. 4-5, 2015, 41 pages.

(Continued)

*Primary Examiner* — Mandeep S Buttar
(74) *Attorney, Agent, or Firm* — Conley Rose, P.C.

(57) ABSTRACT

A system, including a first pipeline and a second pipeline, where the first pipeline includes a first steam pipe, a first liquid pipe, and an evaporation section connected between the first steam pipe and the first liquid pipe, and the second pipeline includes a second steam pipe, a second liquid pipe, and a heat exchanger connected between the second steam pipe and the second liquid pipe. Two pairs of quick connectors are respectively connected between the first steam pipe and the second steam pipe and between the first liquid pipe and the second liquid pipe. The loop heat pipe includes a valve and a nozzle that are configured for vacuum pumping. Refrigerant is provided inside the loop heat pipe. A capillary structure is provided inside the evaporation section to provide a capillary suction force to enable the refrigerant to circulate in the loop heat pipe.

20 Claims, 3 Drawing Sheets

(52) U.S. Cl.
CPC ..... *H05K 7/20327* (2013.01); *H05K 7/20336* (2013.01); *H05K 7/20381* (2013.01); *H05K 7/20672* (2013.01); *H05K 7/20809* (2013.01)

(58) Field of Classification Search
USPC ........... 361/700; 62/259.2, 169, 268, 104.21, 62/104.32, 71, 104.19, 104.26
See application file for complete search history.

(56) References Cited

U.S. PATENT DOCUMENTS

| | | | | |
|---|---|---|---|---|
| 2003/0051859 | A1* | 3/2003 | Chesser | F28D 15/043 165/46 |
| 2008/0121309 | A1* | 5/2008 | Boise | A63H 27/10 141/313 |
| 2008/0259566 | A1* | 10/2008 | Fried | H05K 7/20809 361/699 |
| 2009/0126909 | A1* | 5/2009 | Ellsworth, Jr. | H05K 7/20772 165/104.33 |
| 2009/0161312 | A1* | 6/2009 | Spearing | H05K 7/20727 361/679.47 |
| 2010/0163212 | A1* | 7/2010 | Chin | F28D 15/0266 165/104.26 |
| 2010/0186931 | A1 | 7/2010 | Obara et al. | |
| 2011/0061744 | A1* | 3/2011 | Zillig | F15B 21/042 137/15.01 |
| 2012/0111036 | A1* | 5/2012 | Campbell | F25B 25/005 62/115 |
| 2012/0137718 | A1* | 6/2012 | Uchida | H05K 7/20336 62/259.2 |
| 2012/0180979 | A1 | 7/2012 | Harrington | |
| 2013/0138252 | A1 | 5/2013 | Chainer et al. | |
| 2017/0328497 | A1* | 11/2017 | Dantin | B64D 13/00 |

FOREIGN PATENT DOCUMENTS

| | | |
|---|---|---|
| CN | 101075593 A | 11/2007 |
| CN | 101634533 A | 1/2010 |
| CN | 201521927 U | 7/2010 |
| CN | 201819599 U | 5/2011 |
| CN | 102226658 A | 10/2011 |
| CN | 102883581 A | 1/2013 |
| CN | 203120357 U | 8/2013 |
| CN | 103327790 A | 9/2013 |
| CN | 104534600 A | 4/2015 |
| CN | 104735959 A | 6/2015 |
| EP | 0243239 A2 | 10/1987 |
| JP | H09170791 A | 6/1997 |
| WO | 2008153071 A1 | 12/2008 |

OTHER PUBLICATIONS

Maydanik, Y., et al., "Loop heat pipes," Applied Thermal Engineering 25, Jun. 1, 2004, pp. 635-657.
Jianfeng, C., et al., "Startup and Operation of Loop Heat Pipes in Different States," Collected Works of the 8th National Heat Pipe Conference, Jul. 2002, 6 pages.
English Translation of Jianfeng, C., et al., "Startup and Operation of Loop Heat Pipes in Different States," Collected Works of the 8th National Heat Pipe Conference, Jul. 2002, 8 pages.
Foreign Communication From a Counterpart Application, PCT Application No. PCT/CN2015/092689, International Search Report dated Jul. 14, 2016, 5 pages.
Machine Translation and Abstract of Chinese Publication No. CN1224830, Aug. 4, 1999, 35 pages.
Foreign Communication From a Counterpart Application, European Application No. 15902470.2, Extended European Search Report, dated Dec. 12, 2017, 8 pages.
Machine Translation and Abstract of Chinese Publication No. CN101634533, Jan. 27, 2010, 5 pages.
Machine Translation and Abstract of Chinese Publication No. CN201521927, Jul. 7, 2010, 5 pages.
Foreign Communication From a Counterpart Application, Chinese Application No. 201580001226.6, Chinese Office Action dated Jun. 12, 2018, 9 pages.
Machine Translation and Abstract of Chinese Publication No. CN1570534, Jan. 26, 2005, 9 pages.
Machine Translation and Abstract of Chinese Publication No. CN101075593, Nov. 21, 2007, 11 pages.
Machine Translation and Abstract of Chinese Publication No. CN102226658, Oct. 26, 2011, 8 pages.
Machine Translation and Abstract of Chinese Publication No. CN103327790, Sep. 25, 2013, 17 pages.
Machine Translation and Abstract of Chinese Publication No. CN201819599, May 4, 2011, 13 pages.
Machine Translation and Abstract of European Publication No. EP0243239, Oct. 28, 1987, 7 pages.
Machine Translation and Abstract of Japanese Publication No. JPH09170791, Jun. 30, 1997, 10 pages.
Foreign Communication From a Counterpart Application, Chinese Application No. 201580001226.6, Chinese Office Action dated Dec. 29, 2018, 6 pages.

* cited by examiner

HEAT-PIPE HEAT DISSIPATION SYSTEM AND POWER DEVICE

CROSS-REFERENCE TO RELATED APPLICATIONS

This application is a continuation of International Patent Application No. PCT/CN2015/092689 filed on Oct. 23, 2015, which is hereby incorporated by reference in its entirety.

TECHNICAL FIELD

The present disclosure relates to the field of heat dissipation technologies, and in particular, to a heat-pipe heat dissipation system and a power device.

BACKGROUND

Increasingly high performance and density of information technology (IT) devices have resulted in increasingly high power consumption of a system. Limited by fan performance and system noise, traditional air cooling gradually approaches its heat dissipation capability limit of the traditional air cooling. Liquid cooling, on the contrary, receives increasing attention from people due to its high heat dissipation capability and low noise.

A liquid-cooled heat dissipation system applied to a cabinet mainly includes a cabinet, a circulation system, and an external cooling source, and the circulation system transfers heat from the cabinet to the external cooling source to implement heat dissipation. In the cabinet, there are a relatively large quantity of boards. A heat dissipation pipeline that provides heat dissipation for a heat emitting element on a board is disposed on the board. The heat dissipation pipeline is connected to a hose. A quick connector mounted to the hose connects the heat dissipation pipeline to a main liquid pipeline of the circulation system in the cabinet. The main liquid pipeline is powered by a pump and provides refrigerant for each board to absorb heat from the board. Because the refrigerant is driven by the pump, relatively high pressure is present. Therefore, the quick connector is exposed to a risk of leakage when the board is connected to the system pipeline, and the system is caused to be short-circuited after liquid drops to the board. Moreover, the pump is a motion part that requires very high reliability, and a backup is needed, leading to very high costs.

SUMMARY

To resolve the foregoing problem, the present disclosure provides a heat-pipe heat dissipation system, which provides advantages of high heat transfer efficiency, good reliability, and no risk of refrigerant leakage.

To achieve the foregoing objective, implementation manners of the present disclosure provide the following technical solutions.

According to a first aspect, the present disclosure provides a heat-pipe heat dissipation system, including a first pipeline, a second pipeline, and two pairs of quick connectors, where the first pipeline includes a first steam pipe, a first liquid pipe, and an evaporation section connected between the first steam pipe and the first liquid pipe. The second pipeline includes a second steam pipe, a second liquid pipe, and a heat exchanger connected between the second steam pipe and the second liquid pipe, and one pair of the quick connectors is connected between the first steam pipe and the second steam pipe, and the other pair of the quick connectors is connected between the first liquid pipe and the second liquid pipe, such that the first pipeline and the second pipeline are joined to form a loop heat pipe, where the loop heat pipe includes a vacuum-pumping structure, refrigerant is provided inside the loop heat pipe, a capillary structure is provided inside the evaporation section, and the capillary structure provides a capillary suction force to enable the refrigerant to circulate in the loop heat pipe.

In a first possible implementation manner, the second pipeline further includes a liquid storage tank, and the liquid storage tank is connected to the second liquid pipe and configured to regulate an amount of refrigerant in the loop heat pipe.

With reference to the first possible implementation manner, in a second possible implementation manner, the liquid storage tank includes a liquid inlet and a liquid outlet, the liquid storage tank is serially connected to the second liquid pipeline using the liquid inlet and the liquid outlet, and the liquid outlet is disposed at the bottom of the liquid storage tank or at a position on a side wall of the liquid storage tank close to the bottom of the liquid storage tank.

In a third possible implementation manner, the vacuum-pumping structure includes a valve and a nozzle, and the valve is connected between the nozzle and the second steam pipe.

In a fourth possible implementation manner, the first steam pipe, the first liquid pipe, the second steam pipe, and the second liquid pipe are all rigid pipes.

With reference to the fourth possible implementation manner, in a fifth possible implementation manner, a length of the first steam pipe is less than a length of the second steam pipe, and a length of the first liquid pipe is less than a length of the second liquid pipe.

According to a second aspect, the present disclosure provides a power device, including the heat-pipe heat dissipation system according to any one of the first aspect or the implementation manners of the first aspect, a cabinet, and an electronic module, where the electronic module is disposed inside the cabinet, and in the heat-pipe heat dissipation system, the first pipeline is disposed in the electronic module, the evaporation section is in contact with a heat emitting element of the electronic module, and the second pipeline is disposed in the cabinet.

In a first possible implementation manner, the cabinet includes a front end and a rear end, the electronic module is placed into the cabinet from the front end of the cabinet, and the heat exchanger of the second pipeline is located at the rear end of the cabinet.

With reference to the first possible implementation manner, in a second possible implementation manner, the present disclosure further includes a cooling system disposed outside the cabinet, where the heat exchanger is connected to the cooling system.

According to a third aspect, the present disclosure further provides a power device, including a cabinet, multiple electronic modules, and a heat-pipe heat dissipation system, where the multiple electronic modules are layered inside the cabinet, and the heat-pipe heat dissipation system includes multiple first pipelines, multiple second steam pipes, multiple second liquid pipes, and a heat exchanger, where the multiple first pipelines are respectively disposed in the multiple electronic modules, each first pipeline includes a first steam pipe, a first liquid pipe, and an evaporation section that is connected between the first steam pipe and the first liquid pipe, the evaporation section is in contact with a heat emitting element of the electronic module, the heat exchanger is disposed in the cabinet and is disposed opposite to the multiple electronic modules, one end of each second steam pipe is connected to a respective first steam pipe in a pluggable manner and the other end of each second steam pipe is connected to the heat exchanger, one end of each second liquid pipe is connected to a respective first liquid pipe in a pluggable manner and the other end of the second liquid pipe is connected to the heat exchanger, and the multiple first pipelines, the multiple second steam pipes, the multiple second liquid pipes, and the heat exchanger together form multiple parallel loop heat pipes, where each loop heat pipe comprises a vacuum-pumping structure, refrigerant is provided inside each loop heat pipe, a capillary structure is provided inside the evaporation section, and the capillary structure provides a capillary suction force to enable the refrigerant to circulate in the loop heat pipe.

In a first possible implementation manner, one end of each second steam pipe and the respective first steam pipe are joined by connecting one pair of quick connectors, and each second liquid pipe and the respective first liquid pipe are joined also by connecting one pair of quick connectors.

With reference to the first possible implementation manner, in a second possible implementation manner, multiple liquid storage tanks are further included, where the multiple liquid storage tanks are connected to the second liquid pipes respectively and configured to regulate amounts of refrigerant in the loop heat pipes.

With reference to the second possible implementation manner, in a third possible implementation manner, the liquid storage tank includes a liquid inlet and a liquid outlet, the liquid storage tank is serially connected to the second liquid pipeline using the liquid inlet and the liquid outlet, and the liquid outlet is disposed at the bottom of the liquid storage tank or at a position on a side wall of the liquid storage tank that is close to the bottom of the liquid storage tank.

In a fourth possible implementation manner, the vacuum-pumping structure includes a valve and a nozzle, and the valve is connected between the nozzle and the second steam pipe.

In a fifth possible implementation manner, the first steam pipe, the first liquid pipe, the second steam pipe, and the second liquid pipe are all rigid pipes.

With reference to the fifth possible implementation manner, in a sixth possible implementation manner, a length of the first steam pipe is less than a length of the second steam pipe, and a length of the first liquid pipe is less than a length of the second liquid pipe.

In a seventh possible implementation manner, the cabinet includes a front end and a rear end, the multiple electronic modules are placed into the cabinet from the front end of the cabinet, and the heat exchanger is located at the rear end of the cabinet.

With reference to the seventh possible implementation manner, in an eighth possible implementation manner, a cooling system disposed outside the cabinet is further included, where the heat exchanger is connected to the cooling system.

With reference to the seventh possible implementation manner, in a ninth possible implementation manner, a backplane is disposed inside the cabinet, the backplane is located between the multiple electronic modules and the heat exchanger, and the multiple electronic modules are all electrically connected to the backplane.

In the heat-pipe heat dissipation system according to the present disclosure, the two pairs of quick connectors are connected respectively between the first steam pipe and the second steam pipe and between the first liquid pipe and the second liquid pipe. In this way, the first pipeline and the second pipeline are joined to form the loop heat pipe, and a capillary action in the loop heat pipe is utilized to implement circulation of the refrigerant in the loop heat pipe. No additional driving element, for example, a pump, needs to be added to drive the circulation of the refrigerant, such that the heat-pipe heat dissipation system has stable reliability. The circulation of the refrigerant is driven by a capillary force. The driving force is small, and therefore there is no risk of refrigerant leakage at joints of the quick connectors. Moreover, negative pressure is present inside the loop heat pipe. In a process of connecting or disconnecting the quick connectors, the refrigerant is exposed to a negative pressure state and therefore will not leak. The refrigerant implements heat exchange in the loop heat pipe by means of phase change. Heat transfer efficiency is high.

BRIEF DESCRIPTION OF DRAWINGS

To describe the technical solutions in the embodiments of the present disclosure more clearly, the following briefly describes the accompanying drawings required for describing the embodiments. The accompanying drawings in the following description show merely some embodiments of the present disclosure, and a person of ordinary skill in the art may still derive other drawings from these accompanying drawings without creative efforts.

DESCRIPTION OF EMBODIMENTS

The following clearly describes the technical solutions in the implementation manners of the present disclosure with reference to the accompanying drawings in the implementation manners of the present disclosure.

The present disclosure provides a heat-pipe heat dissipation system and a power device including the heat-pipe heat dissipation system. The power device may be a communications device. The power device includes an electronic module. The electronic module emits heat in an operating process. The heat-pipe heat dissipation system can provide heat dissipation for the electronic module. A circuit board is included inside the electronic module, and a heat emitting element, for example, a central processing unit (CPU), is disposed on the circuit board.

Figure 1:
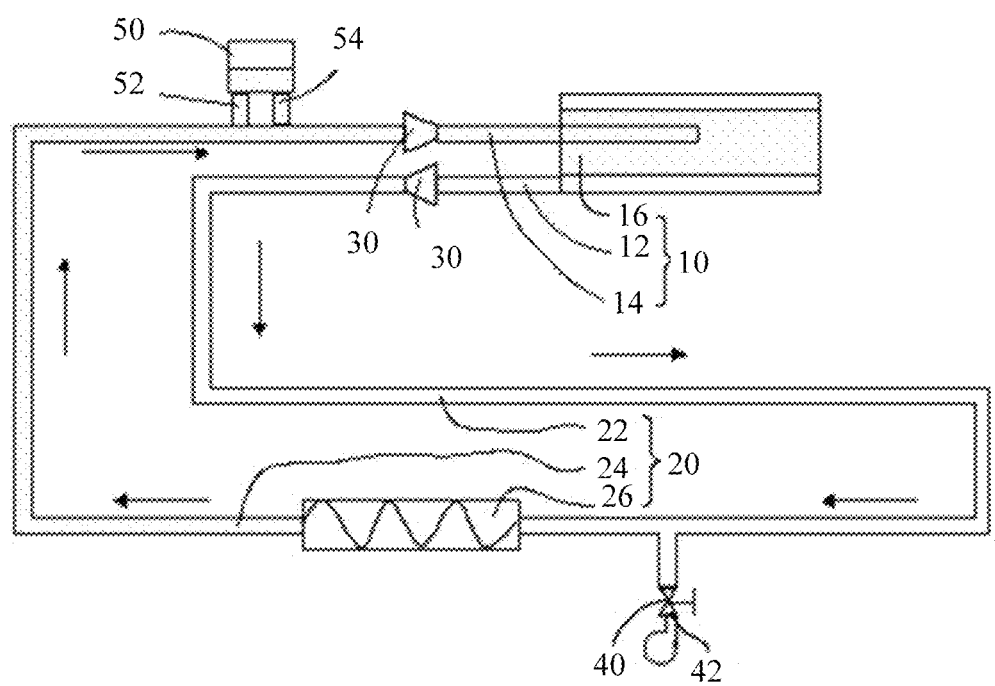
FIG. 1 is a schematic diagram of a heat-pipe heat dissipation system according to an implementation manner of the present disclosure.

Referring to FIG. 1, the heat-pipe heat dissipation system includes a first pipeline 10, a second pipeline 20, and two pairs of quick connectors 30. Both the first pipeline 10 and the second pipeline 20 are in an open state, and the two pairs of quick connectors 30 are connected between the first pipeline 10 and the second pipeline 20, such that the first pipeline 10 and the second pipeline 20 form a closed loop.

The first pipeline 10 includes a first steam pipe 12, a first liquid pipe 14, and an evaporation section 16 connected between the first steam pipe 12 and the first liquid pipe 14. The second pipeline 20 includes a second steam pipe 22, a second liquid pipe 24, and a heat exchanger 26 connected between the second steam pipe 22 and the second liquid pipe 24. The two pairs of quick connectors 30 are respectively connected between the first steam pipe 12 and the second steam pipe 22 and between the first liquid pipe 14 and the second liquid pipe 24, such that the first pipeline 10 and the second pipeline 20 are joined to form a loop heat pipe. Each pair of quick connectors 30 includes a quick male connector and a quick female connector. An example in which the first steam pipe 12 and the second steam pipe 22 are joined is used. A structure is as follows. The quick male connector is connected to an end of the first steam pipe 12, and the quick female connector is connected to an end of the second steam pipe 22. Certainly, locations of the quick male connector and the quick female connector are interchangeable. During mounting, by simply inserting the quick male connector and the quick female connector into each other, the first steam pipe 12 and the second steam pipe 22 can be joined quickly. A sealing function can be implemented after the first steam pipe 12 and the second steam pipe 22 are joined, including sealing between the quick connector 30 and the first steam pipe 12 and the second steam pipe 22, and sealing between the quick male connector and the quick female connector. For a joining structure between the first liquid pipe 14 and the second liquid pipe 24, reference may be made to the joint between the first steam pipe 12 and the second steam pipe 22, and details are not described again. A structure of the quick connector 30 used in the present disclosure is not limited. A quick connector of any structure may be used, provided that the first steam pipe 12 and the second steam pipe 22 can be connected quickly, and that the first liquid pipe 14 and the second liquid pipe 24 can be connected quickly.

The loop heat pipe includes a vacuum-pumping structure. Further, the vacuum-pumping structure includes a valve 40 and a nozzle 42. The valve 40 is disposed between the nozzle 42 and the loop heat pipe, and the nozzle 42 is configured for vacuum pumping. That is, a branch for vacuum pumping is mounted to a pipeline of the loop heat pipe. After the first pipeline 10 and the second pipeline 20 are connected, air exists in the loop heat pipe. In this case, air pressure inside the loop heat pipe is the same as atmospheric pressure. By simply connecting the nozzle 42 to a vacuum pump, vacuum pumping can be implemented for the loop heat pipe. After the vacuum pumping, a vacuum environment is formed inside the loop heat pipe, and a state of negative pressure is present. The loop heat pipe described in the present disclosure is a high-efficiency phase-change heat transfer apparatus. Gas-liquid transmission pipelines are connected to form a loop, and capillary pressure provided by a capillary wick circulates refrigerant for phase-change heat transfer from a heat source to a heat sink. Refrigerant is provided inside the loop heat pipe, and a capillary structure (also referred to as a capillary wick) is provided inside the evaporation section 16. The capillary structure provides a capillary suction force to enable the refrigerant to circulate in the loop heat pipe. The refrigerant is in a liquid state, and may be water, oil, or a liquid mixture. Because the capillary wick is provided inside the evaporation section 16, the refrigerant may be stored in the capillary wick in the evaporation section 16. The capillary wick is a porous material. In an application environment, the evaporation section 16 is in contact with a heat emitting element. Heat generated by the heat emitting element in operation is transferred to the evaporation section 16, the refrigerant in the evaporation section 16 is vaporized with the heat, and steam flows along the porous material into the first steam pipe 12 under action of the capillary suction force and then flows into the heat exchanger 26 after passing through the second steam pipe 22. In the heat exchanger 26, the steam is liquefied due to a decreased temperature, and liquid flows into the second liquid pipe 24 and then flows into the evaporation section 16 via the first liquid pipe 14. In this way, a circulation flow state is formed. A direction shown by arrows in FIG. 1 is a flow direction of the refrigerant.

In the heat-pipe heat dissipation system according to the present disclosure, the two pairs of quick connectors 30 are connected respectively between the first steam pipe 12 and the second steam pipe 22 and between the first liquid 14 and the second liquid pipe 24. In this way, the first pipeline 10 and the second pipeline 20 are joined to form the loop heat pipe, and a capillary action in the loop heat pipe is utilized to implement circulation of the refrigerant in the loop heat pipe. No additional driving element, for example, a pump, needs to be added to drive the circulation of the refrigerant, such that the heat-pipe heat dissipation system has stable reliability. The circulation of the refrigerant is driven by a capillary force. The driving force is small, and therefore there is no risk of refrigerant leakage at joints of the quick connectors 30. Moreover, negative pressure is present inside the loop heat pipe. In a process of connecting or disconnecting the quick connectors 30, the refrigerant is exposed to a negative pressure state and therefore will not leak. The refrigerant implements heat exchange in the loop heat pipe by means of phase change. Heat transfer efficiency is high.

In an implementation manner, the second pipeline 20 further includes a liquid storage tank 50. The liquid storage tank 50 is connected to the second liquid pipe 24 and configured to regulate an amount of refrigerant in the loop heat pipe. In a circulation flow process of the refrigerant in the loop heat pipe, a change in an amount of heat absorbed by the evaporation section 16 results in a change in refrigerant velocity. The liquid storage tank 50 is serially connected to a pipeline of the loop heat pipe. The liquid storage tank 50 is passed through when the refrigerant flows. The liquid storage tank 50 stores refrigerant and can automatically regulate the amount of refrigerant in the pipeline according to the change in the amount of heat in an operating state. An operating principle is as follows. When power consumption of the heat emitting element in contact with the evaporation section 16 increases, that is, when the amount of heat absorbed by the evaporation section 16 grows, an amount of refrigerant inside the evaporation section 16 converted into steam increases accordingly. In this case, the capillary force in the evaporation section 16 grows. Refrigerant is sucked from the liquid storage tank 50 under action of the capillary force to supplement the refrigerant in the loop heat pipe, such that the amount of refrigerant in the loop heat pipe is kept in a balanced state. Conversely, when power consumption of the heat emitting element in contact with the evaporation section 16 decreases, that is, when the amount of heat absorbed by the evaporation section 16 drops, an amount of refrigerant inside the evaporation section 16 converted into steam decreases accordingly. In this case, the amount of refrigerant in the loop heat pipe increases. At the same time, however, the capillary force of the capillary structure in the evaporation section 16 drops. An amount of refrigerant sucked from the liquid storage tank 50 under action of the capillary force is directly affected by the decreased capillary force, such that the amount of refrigerant sucked from the liquid storage tank 50 decreases. That is, in a process of refrigerant circulation in the loop heat pipe, some added refrigerant are stored in the liquid storage tank 50 (because an amount of refrigerant flowing into the liquid storage tank 50 is greater than an amount of refrigerant flowing out of the liquid storage tank 50). In this way, the amount of refrigerant in the loop heat pipe is kept in a balanced state.

The liquid storage tank 50 includes a liquid inlet 52 and a liquid outlet 54. The liquid storage tank 50 is serially connected to the second liquid pipe 24 using the liquid inlet 52 and the liquid outlet 54. The liquid outlet 54 is disposed at the bottom of the liquid storage tank 50 or at a position on a side wall of the liquid storage tank 50 close to the bottom of the liquid storage tank 50. In this way, after the refrigerant enters the liquid storage tank 50 from the liquid inlet 52, when some refrigerant exits as gas, the gas may be separated from the liquid storage tank 50. The gas rises to an upper portion of the liquid storage tank 50 close to the top, and the refrigerant in a liquid state is in a lower portion close to the bottom. Because the liquid outlet 54 is located at the bottom or at a position on a side wall of the liquid storage tank 50 close to the bottom of the liquid storage tank 50, the refrigerant flowing out from the liquid outlet 54 does not include gas, thereby implementing gas-liquid separation.

The valve 40 and the nozzle 42 are connected to the second steam pipe 22. According to the present disclosure, the liquid storage tank 50, and the valve 40 and the nozzle 42 that are configured for vacuum pumping are mounted to the second pipeline 20, which helps to design a simpler first pipeline 10. As the first pipeline 10 needs to be in contact with a heat emitting electronic module (not shown), this also facilitates mounting of the first pipeline 10 to the electronic module.

In an implementation manner, the first steam pipe 12, the first liquid pipe 14, the second steam pipe 22, and the second liquid pipe 24 are all rigid pipes.

A length of the first steam pipe 12 is less than a length of the second steam pipe 22, and a length of the first liquid pipe 14 is less than a length of the second liquid pipe 24. That is, a distance between a location of the quick connector 30 and the evaporation section 16 is less than a distance between the location of the quick connector 30 and the heat exchanger 26. The quick connector 30 is disposed close to the evaporation section 16, such that the first steam pipe 12 and the first liquid pipe 14 in the first pipeline 10 are designed into a smallest size possible. This helps to reduce a volume of the first pipeline 10 and facilitates mounting of the first pipeline 10 to the electronic module.

Figure 2:
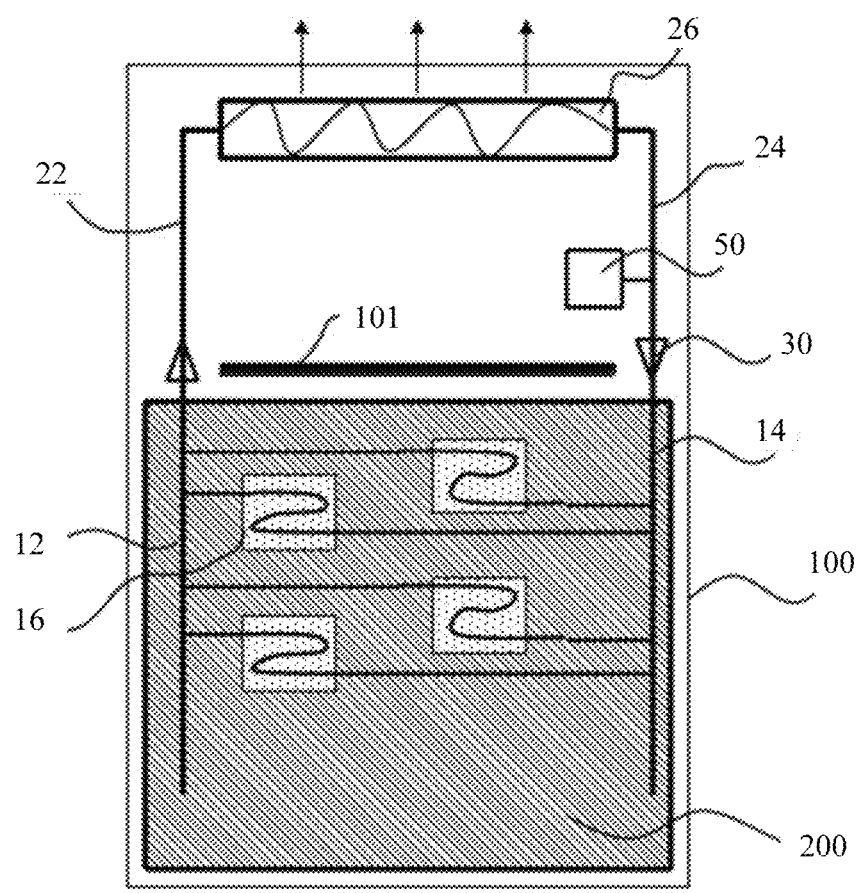
FIG. 2 is a schematic diagram of a power device according to an implementation manner of the present disclosure.

Referring to FIG. 2, a power device provided in the present disclosure includes the heat-pipe heat dissipation system as shown in FIG. 1, a cabinet 100, and an electronic module 200. The electronic module 200 is disposed inside the cabinet 100, the first pipeline of the heat-pipe heat dissipation system is disposed in the electronic module 200, the evaporation section 16 is in contact with a heat emitting element of the electronic module 200, and the second pipeline is fastened inside the cabinet 100.

The cabinet 100 includes a front end and a rear end. The electronic module 200 is placed into the cabinet 100 from the front end of the cabinet 100, and the heat exchanger 26 of the second pipeline is located at the rear end of the cabinet 100. A backplane 101 is disposed inside the cabinet 100.

The power device according to the present disclosure further includes a cooling system (not shown) disposed outside the cabinet 100. The heat exchanger 26 is connected to the cooling system.

Figure 3:
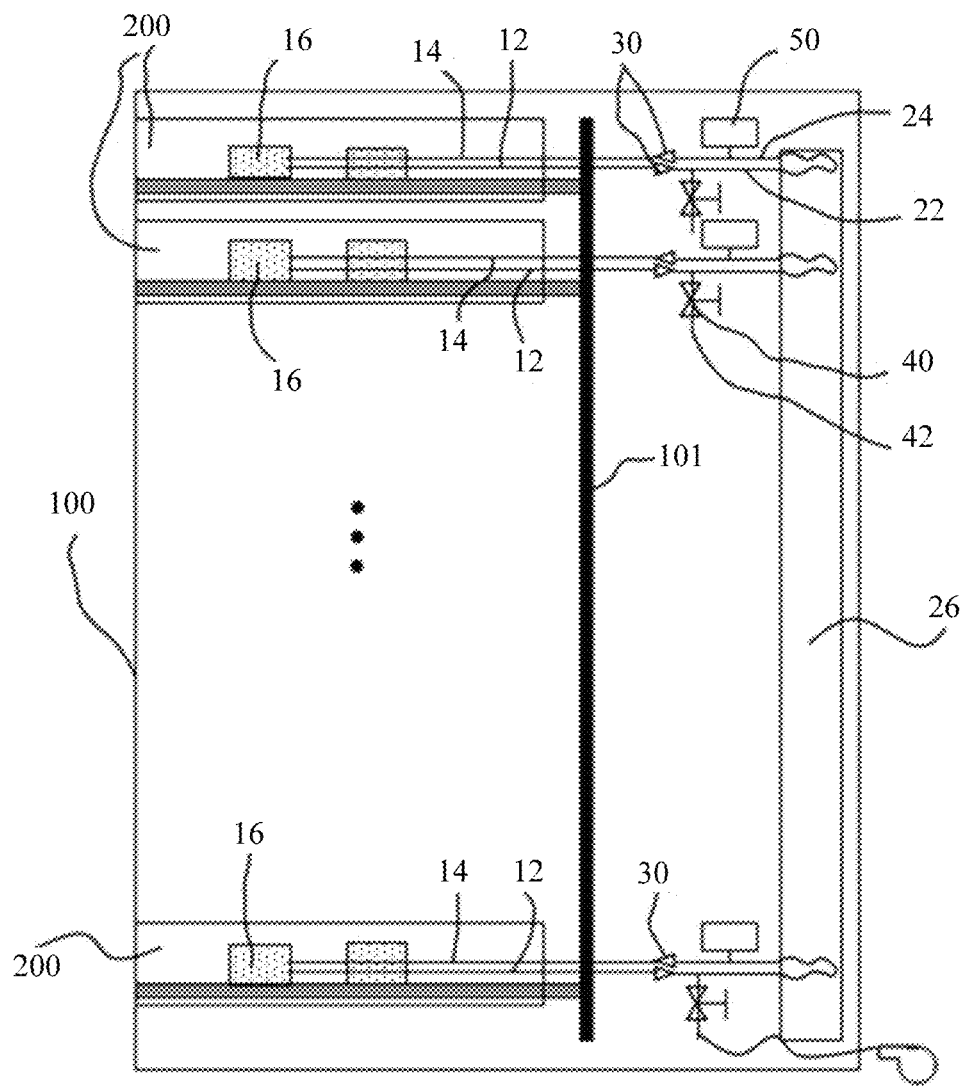
FIG. 3 is a schematic diagram of a power device according to another implementation manner of the present disclosure.

Referring to FIG. 3 and FIG. 1, in another embodiment of the present disclosure, a power device is further provided, including a cabinet 100, multiple electronic modules 200, and a heat-pipe heat dissipation system as shown in FIG. 1. The multiple electronic modules 200 are layered inside the cabinet 100. The heat-pipe heat dissipation system includes multiple first pipelines, multiple second steam pipes 22, multiple second liquid pipes 24, and a heat exchanger 26. The multiple first pipelines are respectively disposed in the multiple electronic modules 200. Each first pipeline includes a first steam pipe 12, a first liquid pipe 14, and an evaporation section 16 connected between the first steam pipe 12 and the first liquid pipe 14. The evaporation section 16 is in contact with a heat emitting element of the electronic module 200. The heat exchanger 26 is disposed in the cabinet 100 and is disposed opposite to the multiple electronic modules 200. One end of each second steam pipe 22 is connected to a respective first steam pipe 12 in a pluggable manner, and the other end of each second steam pipe 22 is connected to the heat exchanger 26. One end of each second liquid pipe 24 is connected to a respective first liquid pipe 14 in a pluggable manner, and the other end of each second liquid pipe 24 is connected to the heat exchanger 26. The multiple first pipelines, the multiple second steam pipes 22, the multiple second liquid pipes 24, and the heat exchanger 26 together form multiple parallel loop heat pipes. Each loop heat pipe includes a valve 40 and a nozzle 42, where the valve 40 is disposed between the nozzle 42 and the loop heat pipe, and the nozzle 42 is configured for vacuum pumping. Refrigerant is provided inside each loop heat pipe. A capillary structure is provided inside the evaporation section 16. The capillary structure provides a capillary suction force to enable the refrigerant to circulate in the loop heat pipe.

One end of each second steam pipe 22 and the respective first steam pipe 12 are joined by connecting one pair of quick connectors 30, and each second liquid pipe 24 and the respective first liquid pipe 14 are joined also by connecting one pair of quick connectors 30. A plugging structure of the quick connectors 30 is the same as a joining structure of the quick connectors 30 in the embodiment of the heat-pipe heat dissipation system.

In this implementation manner, the power device further includes multiple liquid storage tanks 50. The multiple liquid storage tanks 50 are respectively connected to the second liquid pipes 24 and configured to regulate amounts of refrigerant in the loop heat pipes. The liquid storage tank 50 includes a liquid inlet and a liquid outlet. The liquid storage tank 50 is serially connected to the second liquid pipe 24 using the liquid inlet and the liquid outlet. The liquid outlet is disposed at the bottom of the liquid storage tank 50 or at a position on a side wall of the liquid storage tank 50 close to the bottom of the liquid storage tank 50.

In an implementation manner, the valve 40 and the nozzle 42 are connected to the second steam pipe 22.

The first steam pipe 12, the first liquid pipe 14, the second steam pipe 22, and the second liquid pipe 24 are all rigid pipes.

A length of the first steam pipe 12 is less than a length of the second steam pipe 22, and a length of the first liquid pipe 14 is less than a length of the second liquid pipe 24. Those shown in the figure are only illustrative presentations of the pipelines, and do not represent real sizes of the pipelines.

In an implementation manner, the cabinet 100 includes a front end and a rear end. The multiple electronic modules 200 are placed into the cabinet 100 from the front end of the cabinet 100, and the multiple electronic modules 200 are arranged in a layered architecture. The heat exchanger 26 is located at the rear end of the cabinet 100. A heat dissipation fan (not shown) may be further disposed inside the cabinet 100. The heat dissipation fan is generally disposed at the rear end of the cabinet 100. Air flows in the cabinet 100 to implement air-cooled heat dissipation when the heat dissipation fan is working.

A backplane 101 is disposed inside the cabinet 100. The backplane 101 is located between the multiple electronic modules 200 and the heat exchanger 26, and the multiple electronic modules 200 are all electrically connected to the backplane 101. The multiple electronic modules 200 may be pulled out from the cabinet 100 for replacement or maintenance. A quick male connector and a quick female connector of the quick connectors 30 are separated simultaneously when the electronic module 200 is removed from the cabinet 100. Because a negative pressure state is present inside the loop heat pipe, even though the quick connectors 30 are separated, the presence of negative pressure still ensures that refrigerant in a pipeline does not leak.

The foregoing descriptions are implementation manners of the present disclosure. It should be noted that a person of ordinary skill in the art may make certain improvements and polishing without departing from the principle of the present disclosure and the improvements and polishing shall fall within the protection scope of the present disclosure.

What is claimed is:

1. A heat-pipe heat dissipation system, comprising:
   a first pipeline comprising a first steam pipe, a first liquid pipe, and an evaporation section coupled between the first steam pipe and the first liquid pipe, wherein the evaporation section comprises a plurality of separate evaporators, wherein all of the plurality of separate evaporators are coupled together in a parallel manner between the first steam pipe and the first liquid pipe using additional piping, and wherein each of the plurality of separate evaporators is configured to cool an electronic component;
   a second pipeline comprising a second steam pipe, a second liquid pipe, and a single heat exchanger coupled between the second steam pipe and the second liquid pipe, wherein the single heat exchanger is coupled to all of the plurality of separate evaporators and supports cooling by all of the plurality of separate evaporators;
   a first pair of connectors coupled between the first steam pipe and the second steam pipe;
   a second pair of connectors coupled between the first liquid pipe and the second liquid pipe such that the first pipeline and the second pipeline are joined to form a loop heat pipe, wherein the loop heat pipe comprises a vacuum-pumping structure that creates a negative pressure state within the heat-pipe heat dissipation system, wherein the loop heat pipe comprises refrigerant inside the loop heat pipe, wherein a capillary structure is provided inside the evaporation section, and wherein the capillary structure provides a capillary suction force to enable the refrigerant to circulate in the loop heat pipe;
   a liquid storage tank comprising an inlet line and an outlet line, wherein both the inlet line and the outlet line are coupled to the second liquid pipe of the second pipeline, wherein the liquid storage tank stores the refrigerant and automatically regulates an amount of the refrigerant in the loop heat pipe according to a change in an amount of heat in an operating state; and
   a backplane comprising a first side and a second side, wherein the first pipeline that cools the electronic components extends from the first side of the backplane to the second side of the backplane, and wherein the first pair of connectors, the second pair of connectors, and the liquid storage tank are located between the second side of the backplane and the heat exchanger.

2. The heat-pipe heat dissipation system of claim 1, wherein the refrigerant is circulated within the loop heat pipe under capillary action without use of a mechanical pump.

3. The heat-pipe heat dissipation system of claim 2, wherein the outlet line of the liquid storage tank is disposed at a bottom of the liquid storage tank or at a position on a side wall of the liquid storage tank close to the bottom of the liquid storage tank.

4. The heat-pipe heat dissipation system of claim 1, wherein the vacuum-pumping structure comprises a valve and a nozzle, and wherein the valve is coupled between the nozzle and the second steam pipe.

5. The heat-pipe heat dissipation system of claim 1, wherein the first steam pipe, the first liquid pipe, the second steam pipe, and the second liquid pipe are all rigid pipes.

6. The heat-pipe heat dissipation system of claim 5, wherein a length of the first steam pipe is less than a length of the second steam pipe, and Wherein a length of the first liquid pipe is less than a length of the second liquid pipe.

7. A power device, comprising:
   a heat-pipe heat dissipation system, comprising:
      a first pipeline comprising a first steam pipe, a first liquid pipe, and an evaporation section coupled between the first steam pipe and the first liquid pipe, wherein the evaporation section comprises a plurality of separate evaporators, wherein all of the plurality of separate evaporators are coupled together in a parallel manner between the first steam pipe and the first liquid pipe using additional piping, and wherein each of the plurality of separate evaporators is configured to cool an electronic component;
      a second pipeline comprising a second steam pipe, a second liquid pipe, and a single heat exchanger coupled between the second steam pipe and the second liquid pipe, wherein the single heat exchanger is coupled to all of the plurality of separate evaporators and supports cooling by all of the plurality of separate evaporators;
      a first pair of connectors coupled between the first steam pipe and the second steam pipe;
      a second pair of connectors coupled between the first liquid pipe and the second liquid pipe such that the first pipeline and the second pipeline are joined to form a loop heat pipe, wherein the loop heat pipe comprises a vacuum-pumping structure that creates a negative pressure state within the heat-pipe heat dissipation system, wherein the loop heat pipe comprises refrigerant inside the loop heat pipe, wherein a capillary structure is provided inside the evaporation section, and wherein the capillary structure provides a capillary suction force to enable the refrigerant to circulate in the loop heat pipe;
      a liquid storage tank comprising an inlet line and an outlet line, wherein both the inlet line and the outlet line are coupled to the second liquid pipe of the second pipeline, wherein the liquid storage tank stores the refrigerant and automatically regulates an amount of the refrigerant in the loop heat pipe according to a change in an amount of heat in an operating state; and
      a backplane comprising a first side and a second side, wherein the first pjpeline that cools the electronic components extends from the first side of the backplane to the second side of the backplane, and wherein the first pair of connectors, the second pair of connectors, and the liquid storage tank are located between the second side of the backplane and the single heat exchanger;

a cabinet encompassing the heat-pipe heat dissipation system; and a heat-emitting electronic device disposed inside the cabinet, wherein the heat-emitting electronic device comprises the electronic components, wherein the first pipeline of the heat-pipe heat dissipation system is coupled to the heat-emitting electronic device, and wherein the evaporation section is in contact with the electronic components of the heat-emitting electronic device.

8. The power device of claim 7, wherein the cabinet comprises a front end and a rear end, wherein the heat-emitting electronic device is located in the cabinet from the front end of the cabinet, and wherein the heat exchanger of the second pipeline is located at the rear end of the cabinet.

9. The power device of claim 8, wherein the refrigerant is circulated within the loop heat pipe under capillary action without use of a mechanical pump.

10. The power device of claim 7, wherein the outlet line of the liquid storage tank is disposed at a bottom of the liquid storage tank or at a position on a side wall of the liquid storage tank close to the bottom of the liquid storage tank.

11. A power device, comprising:
a cabinet;
a plurality of heat-emitting electronic devices layered inside the cabinet; and
a heat-pipe heat dissipation system comprising;
 a plurality of first pipelines disposed in the heat-emitting electronic devices, wherein each first pipeline comprises a first steam pipe, a first liquid pipe, and an evaporation section coupled between the first steam pipe and the first liquid pipe, wherein each evaporation section comprises a plurality of separate evaporators, wherein all of the plurality of separate evaporators are coupled together in a parallel manner between the first steam pipe and the first liquid pipe using additional piping, and wherein each of the plurality of separate evaporators is configured to cool an electronic component;
 a plurality of second pipelines, wherein each second pipeline comprises a second steam pipe, a second liquid pipe, and a single heat exchanger coupled between the second steam pipe and the second liquid pipe, wherein the single heat exchanger is coupled to all of the plurality of separate evaporators and supports cooling by all of the plurality of separate evaporators, wherein the evaporation section is in contact with a heat-emitting element of the heat-emitting electronic device, wherein the heat-emitting element comprises the electronic components, wherein the heat exchanger is disposed in the cabinet and is disposed opposite to the heat-emitting electronic devices, wherein one end of each second steam pipe is coupled to a respective first steam pipe in a pluggable manner, Wherein the other end of each second steam pipe is coupled to the heat exchanger, wherein one end of each second liquid pipe is coupled to a respective first liquid pipe in the pluggable manner, wherein the other end of the second liquid pipe is coupled to the heat exchanger, wherein the first pipelines, the second steam pipes, the second liquid pipes, and the heat exchanger together form a plurality of parallel loop heat pipes, wherein each loop heat pipe comprises a vacuum-pumping structure that creates a negative pressure state within the hem-pipe heat dissipation system, wherein each loop heat pipe comprises refrigerant inside each loop heat pipe, wherein a capillary structure is provided inside each evaporation section, and wherein the capillary structure provides a capillary suction force to enable the refrigerant to circulate in each loop heat pipe;
 a plurality of liquid storage tanks, wherein each liquid storage tank comprises an inlet line and an outlet line, wherein both the inlet line and the outlet line are coupled to the second liquid pipe of one of the second pipelines, wherein each liquid storage tank stores the refrigerant and automatically regulates an amount of the refrigerant in the respective loop heat pipe according to a change in an amount of heat in an operating state; and
 a backplane comprising a first side and a second side, wherein each first pipeline that cools the electronic components extends from the first side of the backplane to the second side of the backplane, and wherein a first pair of connectors ,a second pair of connectors, and each liquid storage tank are located between the second side of the backplane and the heat exchanger.

12. The power device of claim 11, wherein one end of each second steam pipe and the respective first steam pipe are joined by coupling the first pair of connectors, and wherein each second liquid pipe and the respective first liquid pipe are also joined by coupling the second pair of connectors.

13. The power device of claim 12, wherein the refrigerant is circulated within the loop heat pipes under capillary action without use of a mechanical pump.

14. The power device of claim 13, wherein the outlet line of each liquid storage tank is disposed at a bottom of the liquid storage tank or at a position on a side wall of the liquid storage tank close to the bottom of the liquid storage tank.

15. The power device of claim 12, wherein the vacuum-pumping structure comprises a valve and a nozzle, and wherein the valve is coupled between the nozzle and a respective second steam pipe.

16. The power device of claim 11, wherein each of the first steam pipe, the first liquid pipe, the second steam pipe, and the second liquid pipe are all rigid pipes.

17. The power device of claim 16, wherein a length of each first steam pipe is less than a length of each second steam pipe, and wherein a length of each first liquid pipe is less than a length of each second liquid pipe.

18. The power device of claim 12, wherein the cabinet comprises a front end and a rear end, wherein the heat-emitting electronic devices are placed into the cabinet from the front end of the cabinet, and wherein the heat exchanger is located at the rear end of the cabinet.

19. The power device of claim 18, wherein the refrigerant comprises water, oil, or a liquid mixture.

20. The power device of claim 18, wherein the backplane is disposed inside the cabinet, wherein the backplane is located between the heat-emitting electronic devices and the heat exchanger, and wherein the heat-emitting electronic devices are all electrically coupled to the backplane.

* * * * *

UNITED STATES PATENT AND TRADEMARK OFFICE
CERTIFICATE OF CORRECTION

PATENT NO. : 10,470,339 B2  
APPLICATION NO. : 15/468859  
DATED : November 5, 2019  
INVENTOR(S) : Yaofeng Peng et al.

Page 1 of 1

It is certified that error appears in the above-identified patent and that said Letters Patent is hereby corrected as shown below:

Claim 6, Column 10, Line 21: "Wherein a length" should read "wherein a length"

Claim 11, Column 11, Line 59: "Wherein the other" should read "wherein the other"

Claim 11, Column 12, Line 5: "hem-pipe" should read "heat-pipe"

Claim 11, Column 12, Line 24: "connectors ,a" should read "connectors, a"

Signed and Sealed this  
Fourteenth Day of January, 2020

Andrei Iancu  
*Director of the United States Patent and Trademark Office*